(12) United States Patent
Shibuya et al.

(10) Patent No.: US 8,287,995 B2
(45) Date of Patent: Oct. 16, 2012

(54) GLASS MEMBER PROVIDED WITH SEALING MATERIAL LAYER, AND ELECTRONIC DEVICE USING IT AND PROCESS FOR PRODUCING THE ELECTRONIC DEVICE

(75) Inventors: Koichi Shibuya, Tokyo (JP); Asahi Ide, Tokyo (JP); Sohei Kawanami, Koriyama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/113,180

(22) Filed: May 23, 2011

(65) Prior Publication Data
US 2011/0223360 A1    Sep. 15, 2011

Related U.S. Application Data

(63) Continuation of application No. PCT/JP2009/069875, filed on Nov. 25, 2009.

(30) Foreign Application Priority Data

Nov. 26, 2008 (JP) ................................. 2008-301535

(51) Int. Cl.
*B32B 5/16*       (2006.01)
*H05B 33/04*      (2006.01)
*H05B 6/00*       (2006.01)
*H01J 9/26*       (2006.01)
*B29C 65/16*      (2006.01)
*H01L 31/042*     (2006.01)
*H01L 27/142*     (2006.01)

(52) U.S. Cl. ........ 428/213; 428/325; 428/331; 428/402; 428/917; 445/25; 313/512; 313/506; 264/482; 156/107; 156/272.8; 257/414; 136/244; 65/33.2

(58) Field of Classification Search .................... 428/34, 428/213, 325, 331, 402.2, 690, 917; 313/504, 313/512, 506; 445/24, 25; 264/482; 156/107, 156/272.8; 257/414; 136/244; 65/33.2
See application file for complete search history.

(56) References Cited

U.S. PATENT DOCUMENTS
2004/0207314 A1    10/2004    Aitken et al.

FOREIGN PATENT DOCUMENTS
JP         2000-103642       4/2000
(Continued)

OTHER PUBLICATIONS
WO-2007/067402, Jun. 2007.*
(Continued)

*Primary Examiner* — Donald J Loney
(74) *Attorney, Agent, or Firm* — Oblon, Spivak, McClelland, Maier & Neustadt, L.L.P.

(57) ABSTRACT

The invention seeks to increase the sealing property and the reliability of an electronic device by suppressing cracks, fractures and the like of a glass substrate at the time of laser sealing. A glass substrate 3 has a sealing region. On the sealing region, a sealing material layer 5 comprising a glass material for sealing containing a low-expansion filler and a laser absorbent is provided. The glass material for sealing contains no low-expansion filler particles having particle sizes exceeding the thickness T of the sealing material layer 5 and contains low-expansion filler particles having particle sizes within a range of from 0.5T to 1T based on the thickness T of the sealing material layer 5 in a volume ratio of from 0.1 to 50%. Such a glass substrate 3 and a glass substrate 2 having an element-formed region provided with an electronic element are laminated, and the sealing material layer 5 is irradiated with a laser light 6 and melted to bond the glass substrates 2 and 3.

16 Claims, 2 Drawing Sheets

FOREIGN PATENT DOCUMENTS

| | | |
|---|---|---|
| JP | 2005-314136 | 11/2005 |
| JP | 2006-049265 | 2/2006 |
| JP | 2006-151774 | 6/2006 |
| JP | 2006-524419 | 10/2006 |
| JP | 2008-115057 | 5/2008 |

OTHER PUBLICATIONS

Machine translation of JP 2008-115057.*

U.S. Appl. No. 13/104,174, filed May 10, 2011, Shibuya, et al.
International Search Report issued Dec. 28, 2009 in PCT/JP09/069875 filed Dec. 14, 2009.
Extended European Search Report issued Mar. 23, 2012 in patent application No. 09829101.6.
U.S. Appl. No. 13/341,188, filed Dec. 30, 2011, Kawanami, et al.

* cited by examiner

Fig. 1
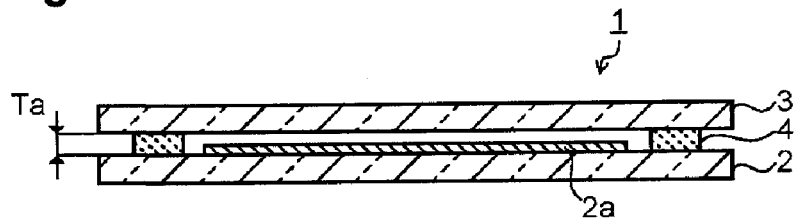
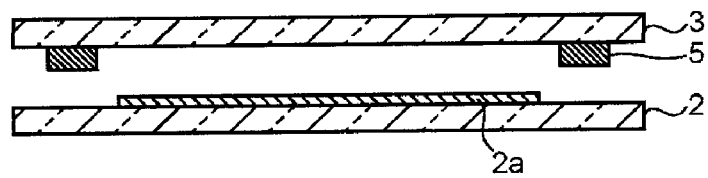
Fig. 2(a)
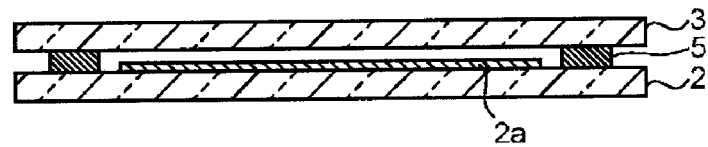
Fig. 2(b)
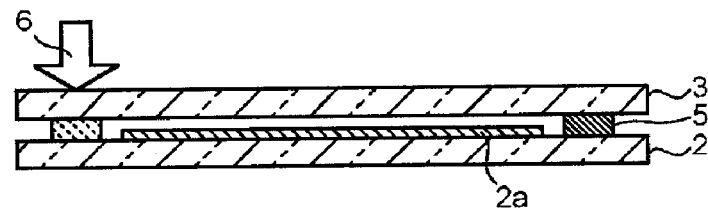
Fig. 2(c)
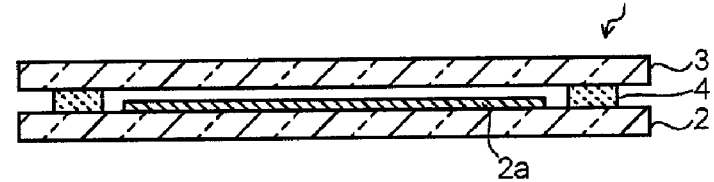
Fig. 2(d)

GLASS MEMBER PROVIDED WITH SEALING MATERIAL LAYER, AND ELECTRONIC DEVICE USING IT AND PROCESS FOR PRODUCING THE ELECTRONIC DEVICE

TECHNICAL FIELD

The present invention relates to a glass member provided with a sealing material layer, and an electronic device using it and a process for producing the electronic device.

BACKGROUND ART

A flat panel display device (FPD) such as an organic EL (electro-luminescence) display (OELD), a plasma display panel (PDP) or a liquid crystal display device (LCD) has such a structure that a glass substrate for an element having a light-emitting element formed and a glass substrate for sealing are disposed to face each other and the light-emitting element is sealed in a glass package comprising two such glass substrates bonded (Patent Document 1). Further, for a solar cell such as a dye-sensitized solar cell, application of a glass package having a solar cell element (photoelectric conversion element) sealed with two glass substrates has been studied (Patent Document 2).

As a sealing material to seal a space between two glass substrates, a sealing resin or a sealing glass has been used. Since an organic EL (OEL) element or the like is likely to undergo deterioration by water, application of sealing glass excellent in the moisture resistance, etc. is in progress. Since the sealing temperature of the sealing glass is at a level of from 400 to 600° C., properties of an electronic element portion of the OEL element or the like will be deteriorated when firing is conducted by using a conventional heating furnace. Accordingly, it has been attempted that a layer of a glass material for sealing containing a laser absorbent is disposed between sealing regions provided on the peripheral portions of two glass substrates, and the layer of the glass material for sealing is irradiated with a laser light to heat and melt the layer thereby to conduct sealing (Patent Documents 1 and 2).

Sealing by irradiation with laser (laser sealing) can suppress thermal influences over the electronic element portion, and on the contrary, it has a disadvantage that cracks, fractures and the like are likely to form on the glass substrate at the time of sealing. In a case where the laser sealing is applied, first, a glass material for sealing containing a laser absorbent is burnt on a sealing region of a glass substrate for sealing to form a layer of the glass material for sealing in a form of a frame. Then, the glass substrate for sealing and a glass substrate for an element are laminated via the layer of the glass material for sealing, and the laminate is irradiated with a laser light from the side of the glass substrate for sealing to heat and melt the entire layer of the glass material for sealing thereby to seal a space between the glass substrates.

The layer of the glass material for sealing in the form of a frame is irradiated with the laser light along it. That is, the layer of the glass material for sealing in the form of a frame is irradiated with the laser light over its perimeter by scanning the layer of the glass material for sealing along it with the laser light from the laser light irradiation starting point. Accordingly, the laser light irradiation completion point rides the irradiation starting point. In a case where the layer of a glass material for sealing in the form of a frame is irradiated with a laser light with scanning over the perimeter, the glass substrate is likely to have cracks, fracture and the like at the laser light irradiation completion point. Alkali-free glass or soda lime glass is used for a glass substrate constituting a glass panel, and particularly soda lime glass has a high thermal expansion coefficient, and accordingly cracks, fractures and the like are likely to form at the time of laser sealing.

As a technique to keep a constant distance between two glass substrates, Patent Document 3 discloses a sealing material having beads such that the maximum particle size and the minimum particle size are within ±20% of the average particle size, added to a glass powder. Patent Document 4 discloses a PDP having a space between glass substrates sealed by a sealing material containing nonporous bead spacers having a grain size within a range of five sixths to 1.5 times the distance between facing glass substrates. Both techniques employ a firing step employing a heating furnace for the sealing step, and the laser sealing is not considered. Further, Patent Document 3 discloses use of beads having a narrow particle size distribution relative to the average particle size, and Patent Document 4 discloses use of beads having a broad particle size distribution relative to the central particle size, and the proportion of particles to the sealing glass is not considered.

PRIOR ART DOCUMENTS

Patent Documents
  Patent Document 1: JP-A-2006-524419
  Patent Document 2: JP-A-2008-115057
  Patent Document 3: JP-A-2006-049265
  Patent Document 4: JP-A-2006-151774

DISCLOSURE OF INVENTION

Technical Problem

It is an object of the present invention to provide a glass member provided with a sealing material layer, an electronic device using it and a process for producing the electronic device, with which the sealing property and the reliability can be increased by suppressing cracks, fracture and the like of a glass substrate at the time of the laser irradiation.

Solution to Problem

A glass member provided with a sealing material layer according to one embodiment of the present invention comprises a glass substrate having a sealing region; and a sealing material layer comprising a glass material for sealing containing a low-expansion filler comprising low-expansion filler particles and a laser absorbent, provided on the sealing region of the glass substrate; wherein the glass material for sealing contains no low-expansion filler particles having particle sizes exceeding the thickness T of the sealing material layer and contains low-expansion filler particles having particles sizes within a range of from 0.5 T to 1 T based on the thickness T of the sealing material layer in a volume ratio of from 0.1 to 50%.

An electronic device according to another embodiment of the present invention comprises a first glass substrate having an element-formed region provided with an electronic element and a first sealing region provided on the outer peripheral side of the element-formed region; a second glass substrate having a second sealing region corresponding to the first sealing region of the first glass substrate; and a sealing layer comprising a melt-bonded layer of a glass material for sealing containing a low-expansion filler comprising low-expansion filler particles and a laser absorbent, formed to seal a space between the first sealing region of the first glass substrate and the second sealing region of the second glass substrate while a space is provided on the element-formed region; wherein the glass material for sealing contains no low-expansion filler particles having particle sizes exceeding the thickness T of the sealing layer and contains low-expansion filler particles having particles sizes within a range of from 0.5 T to 1 T based on the thickness T of the sealing layer in a volume ratio of from 0.1 to 50%.

A process for producing an electronic device according to still another embodiment of the present invention, comprises a step of preparing a first glass substrate having an element-formed region provided with an electronic element and a first sealing region provided on the outer peripheral side of the element-formed region; a step of preparing a second glass substrate having a second sealing region corresponding to the first sealing region of the first glass substrate, and a sealing material layer comprising a glass material for sealing containing a low-expansion filler comprising low-expansion filler particles and a laser absorbent, formed on the second sealing region; a step of laminating the first glass substrate and the second glass substrate via the sealing material layer while a space is formed on the element-formed region; and a step of irradiating the sealing material layer with a laser light through the second glass substrate to melt the sealing material layer thereby to form a sealing layer to seal the space between the first glass substrate and the second glass substrate; wherein the glass material for sealing contains no low-expansion filler particles having particle sizes exceeding the thickness T of the sealing material layer and contains low-expansion filler particles having particles sizes within a range of from 0.5 T to 1 T based on the thickness T of the sealing material layer in a volume ratio of from 0.1 to 50%.

ADVANTAGEOUS EFFECTS OF INVENTION

According to the glass member provided with a sealing material layer, the electronic device using it, and the process for producing an electronic device according to the present invention, the stress formed in the laser light irradiation completion point at the time of the laser sealing is relaxed, whereby cracks, fracture and the like of a glass substrate can be suppressed. Accordingly, it is possible to provide an electronic device having increased sealing property and reliability with good reproducibility.

BRIEF DESCRIPTION OF DRAWINGS

FIG. 1 is a cross-sectional view illustrating the constitution of an electronic device according to the embodiment of the present invention.

FIG. 2 is cross-sectional views illustrating the procedure for production of an electronic device according to the embodiment of the present invention.

DESCRIPTION OF EMBODIMENTS

Figure 3:
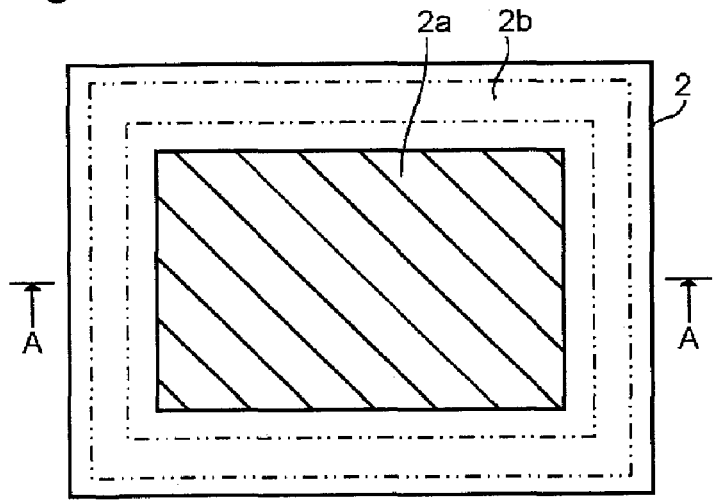
FIG. 3 is a plan view illustrating a first glass substrate used in the procedure for production of an electronic device shown in FIG. 2.
Figure 6:
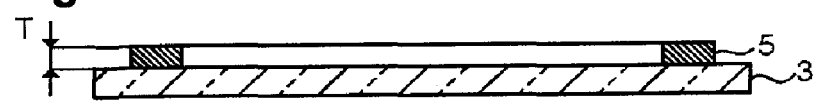
FIG. 6 is a cross-sectional view along the line A-A in FIG. 5.

Now, the embodiments of the present invention will be described with reference to drawings. FIG. 1 is a view illustrating the constitution of an electronic device according to the embodiment of the present invention, FIG. 2 is views illustrating the procedure for production of an electronic device, and FIGS. 3 and 6 are views illustrating the structures of glass substrates used therefor. An electronic device 1 shown in FIG. 1 constitutes a FPD such as an OELD, a PDP or a LCD, an illumination apparatus employing a light-emitting element such as an OEL element, or a solar cell such as a dye-sensitized solar cell.

An electronic device 1 comprises a first glass substrate (glass substrate for an element) having an element-formed region 2a provided with an electronic element, and a second glass substrate (glass substrate for sealing) 3. On the element-formed region 2a of the first glass substrate 2, an electronic element depending on the electronic device 1, for example, an OEL element for an OELD or an OEL illumination, a plasma light-emitting element for a PDP, a liquid crystal display element for a LCD, or a dye-sensitized photoelectric conversion part for a solar cell, is formed. Each of electronic elements such as a light emitting element such as an OEL element or a solar cell element such as a dye-sensitized photoelectric conversion part has known structures, and the electronic element is not limited to such an element structure.

Figure 4:
FIG. 4 is a cross-sectional view along the line A-A in FIG. 3.

The first glass substrate 2 has a first sealing region 2b provided on the outer peripheral side of the element-formed region 2a, as shown in FIGS. 3 and 4. The first sealing region 2b is provided so as to surround the element-formed region 2a. The second glass substrate 3 has a second sealing region 3a shown in FIGS. 5 and 6. The second sealing region 3a is to correspond to the first sealing region 2b. That is, the first sealing region 2b and the second sealing region 3a are provided so as to face each other when the first glass substrate 2 and the second glass substrate 3 are disposed to face each other, to be a sealing layer-formed region (a sealing material layer-formed region with respect to the second glass substrate 3) as described hereinafter.

Each of the first and second glass substrates 2 and 3 comprises alkali-free glass, soda lime glass or the like. Alkali-free glass has a thermal expansion coefficient at a level of from 35 to $40 \times 10^{-7}/°$ C. Soda lime glass has a thermal expansion coefficient at a level of from 85 to $90 \times 10^{-7}/°$ C.

The first glass substrate 2 and the second glass substrate 3 are disposed to face each other to form a space on the element-formed region 2a. The space between the first glass substrate 2 and the second glass substrate 3 are sealed by a sealing layer 4. That is, the sealing layer 4 is formed to seal the space between the sealing region 2b of the first glass substrate 2 and the sealing region 3a of the second glass substrate 3 while a space is provided on the element-formed region 2a. The electronic element formed on the element-formed region 2a is hermetically sealed in a glass panel constituted by the first glass substrate 2, the second glass substrate 3 and the sealing layer 4.

Figure 5:
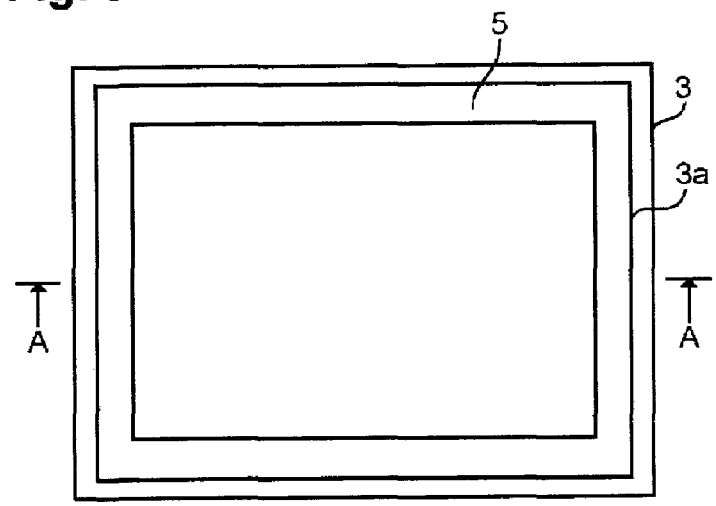
FIG. 5 is a plan view illustrating a second glass substrate used in the procedure for production of an electronic device shown in FIG. 2.

The sealing layer 4 comprises a melt-bonded layer having a sealing material layer 5 formed on the sealing region 3a of the second glass substrate 3 melted by a laser light and bonded on the sealing region 2b of the first glass substrate 2. That is, on the sealing region 3a of the second glass substrate 3 to be used for preparation of the electronic device 1, a sealing material layer 5 in the form of a frame is formed as shown in FIGS. 5 and 6. By melt-bonding the sealing material layer 5 formed on the sealing region 3a of the second glass substrate 3 by heat of the laser light on the sealing region 2b of the first glass substrate 2, a sealing layer 4 to seal the space (element-disposed space) between the first glass substrate 2 and the second glass substrate 3 is formed.

The sealing material layer 5 is a fired layer of a glass material for sealing containing a laser absorbent and a low-expansion filler. The glass material for sealing comprises sealing glass as the main component, and a laser absorbent and a low-expansion filler incorporated. The glass material for sealing may contain additives in addition to the above components as the case requires. For the sealing glass (glass frit) as the main component of the glass material for sealing, for example, low melting glass such as tin-phosphate glass, bismuth glass, vanadium glass or lead glass may be used. Among them, considering the sealing property (adhesion property) to the glass substrates 2 and 3 and the reliability (bonding reliability and hermetically sealing property) and in addition, the influences over the environment and the human body, it is preferred to use sealing glass comprising tin-phosphate glass or bismuth glass.

The tin-phosphate glass (glass frit) preferably has a composition comprising from 20 to 68 mass % of SnO, from 0.5 to 5 mass % of $SnO_2$ and from 20 to 40 mass % of $P_2O_5$ (the total amount will be 100 mass %). SnO is a component to make the glass have a low melting point. If the content of SnO is less than 20 mass %, the viscosity of glass will be high and the sealing temperature will be too high, and if the content exceeds 68 mass %, the glass will not be vitrified.

$SnO_2$ is a component to stabilize glass. If the content of $SnO_2$ is less than 0.5 mass %, $SnO_2$ will be separated and precipitate in the glass softened and melted at the time of the sealing operation, and the fluidity will be impaired and the sealing operation property will be decreased. If the content of $SnO_2$ exceeds 5 mass %, $SnO_2$ is likely to precipitate in the melt of the low melting glass. $P_2O_5$ is a component to form a glass skeleton. If the content of $P_2O_5$ is less than 20 mass %, the glass will not be vitrified, and if the content exceeds 40 mass %, deterioration of the weather resistance which is a drawback specific to phosphate glass may occur.

Here, the mass ratios of SnO and $SnO_2$ in the glass frit can be determined as follows. First, the glass frit (low-melting glass powder) is subjected to acid decomposition, and then the total amount of Sn atoms contained in the glass frit is measured by ICP emission spectroscopy. Then, the amount of $Sn^{2+}$(SnO) can be obtained by the iodometric titration after the acid decomposition, and thus the amount of $Sn^{4+}$($SnO_2$) is determined by subtracting the above obtained amount of $Sn^{2+}$ from the total amount of the Sn atoms.

The glass formed by the above three components has a low glass transition point and is suitable as a sealing material at low temperature, and it may contain e.g. a component to form a glass skeleton such as $SiO_2$, a component to stabilize the glass such as ZnO, $B_2O_3$, $Al_2O_3$, $WO_3$, $MoO_3$, $Nb_2O_5$, $TiO_2$, $ZrO_2$, $Li_2O$, $Na_2O$, $K_2O$, $Cs_2O$, MgO, CaO, SrO or BaO as an optional component. However, if the content of the optional component is too high, the glass will be unstable, whereby devitrification may occur, or the glass transition point or the softening point may be increased. Thus, the total content of the optional components is preferably at most 30 mass %.

The bismuth glass (glass frit) preferably has a composition comprising from 70 to 90 mass % of $Bi_2O_3$, from 1 to 20 mass % of ZnO and from 2 to 12 mass % of $B_2O_3$ (the total content will be 100 mass %). $Bi_2O_3$ is a component to form a glass network. If the content of $Bi_2O_3$ is less than 70 mass %, the softening point of the low melting glass will be high, whereby sealing at low temperature will be difficult. If the content of $Bi_2O_3$ exceeds 90 mass %, the glass will hardly be vitrified and in addition, the thermal expansion coefficient tends to be too high.

ZnO is a component to lower the thermal expansion coefficient or the like. If the content of ZnO is less than 1 mass %, the glass will hardly be vitrified. If the content of ZnO exceeds 20 mass %, the stability at the time of formation of the low melting glass will be decreased, and devitrification is likely to occur. $B_2O_3$ is a component to form a glass skeleton and to broaden a range within which the glass can be vitrified.

If the content of $B_2O_3$ is less than 2 mass %, the glass will hardly be vitrified, and if it exceeds 12 mass %, the softening point will be too high, whereby sealing at low temperature will be difficult even if a load is applied at the time of the sealing.

The glass formed by the above three components has a low glass transition point and is suitable as a sealing material at low temperature, and it may contain an optional component such as $Al_2O_3$, $CeO_2$, $SiO_2$, $Ag_2O$, $MoO_3$, $Nb_2O_3$, $Ta_2O_5$, $Ga_2O_3$, $Sb_2O_3$, $Li_2O$, $Na_2O$, $K_2O$, $Cs_2O$, CaO, SrO, BaO, $WO_3$, $P_2O_5$ or $SnO_x$ (wherein x is 1 or 2). However, if the content of the optional components is too high, the glass will be unstable, whereby devitrification may occur, or the glass transition point or the softening point may be increased. Thus, the total content of the optional components is preferably at most 30 mass %.

The glass material for sealing contains a low-expansion filler. As the low-expansion filler, it is preferred to use at least one member selected from silica, alumina, zirconia, zirconium silicate, cordierite, a zirconium phosphate compound, soda lime glass and borosilicate glass. The zirconium phosphate compound may be $(ZrO)_2P_2O_7$, $AZr_2(PO_4)_3$ (wherein A is at least one member selected from Na, K and Ca), $NbZr_2(PO_4)_3$, $Zr_2(WO_3)(PO_4)_2$ or a composite compound thereof. The low-expansion filler is one having a lower thermal expansion coefficient than the sealing glass as the main component of the glass material for sealing.

The content of the low-expansion filler is properly set so that the thermal expansion coefficient of the sealing glass is close to the thermal expansion coefficients of the glass substrates 1 and 2. The low-expansion filler is contained preferably in an amount of from 15 to 50 vol % to the glass material for sealing, although it depends on the thermal expansion coefficients of the sealing glass and the glass substrates 2 and 3. In a case where each of the glass substrates 2 and 3 is formed by alkali-free glass (thermal expansion coefficient: 35 to $40 \times 10^{-7}$/° C.), it is preferred to add a relatively large amount (for example from 30 to 50 vol %) of the low-expansion filler. In a case where each of the glass substrates 2 and 3 is formed by soda lime glass (thermal expansion coefficient: 85 to $90 \times 10^{-7}$/° C.), it is preferred to add a relatively small amount (for example from 15 to 40 vol %) of the low-expansion filler.

The glass material for sealing further contains a laser absorbent. As the laser absorbent, at least one metal selected from Fe, Cr, Mn, Co, Ni and Cu, or a compound such as an oxide containing the above metal may be used. The content of the laser absorbent is preferably within a range of from 0.1 to 20 vol %, more preferably from 0.1 to 8 vol % to the glass material for sealing. If the content of the laser absorbent is less than 0.1 vol %, the sealing material layer 5 will not sufficiently be melted at the time of laser irradiation. If the content of the laser absorbent exceeds 10 vol %, a portion in the vicinity of an interface with the second glass substrate 3 may locally generate heat at the time of laser irradiation, whereby fractures may occur on the second glass substrate 3, or the fluidity of the glass material for sealing at the time of melting may be deteriorated, whereby the adhesion to the first glass substrate 2 may be decreased. The average particle size of the laser absorbent is preferably from 0.01 to 10 μm, more preferably from 0.1 to 3 μm.

The thickness T of the sealing material layer 5 is set in accordance with the required space between the first glass substrate 2 and the second glass substrate 3, i.e. the thickness Ta of the sealing layer 4. The electronic device 1 and the process for producing it according to this embodiment are particularly effective when the thickness T of the sealing material layer 5 is at least 10 μm. Even in a case where a sealing material layer 5 having such a thickness T is irradiated with a laser light for sealing, according to this embodiment, it is possible to suppress failures due to cracks or fractures of the glass substrates 2 and 3, the separation or fractures of the sealing layer 4, and the like, while hermetic sealing property of a glass panel constituted by the first and second glass substrates 2 and 3 and the sealing layer 4 is increased.

With respect to the low-expansion filler contained in the glass material for sealing, the particle shape is controlled based on the thickness T of the sealing material layer 5. That is, the low-expansion filler contains no particles (low-expansion filler particles) having particle sizes exceeding the thickness T of the sealing material layer 5 and contains particles (low-expansion filler particles) having particle sizes within a range of from 0.5 T to 1 T based on the thickness T within such a range that their volume ratio in the glass material for sealing will be from 0.1 to 50%. In other words, the glass material for sealing contains no low-expansion filler particles having particle sizes exceeding the thickness T and contains low-expansion filler particles having particle sizes within a range of from 0.5 T to 1 T in a volume ratio of from 0.1 to 50%.

The low-expansion filler having the above-described particle constitution is obtainable e.g. by mixing at least two low-expansion filler powders differing in the particle size distribution or by classification (e.g. sieving or air classification) of a low-expansion filler powder. For example, a low-expansion filler having a desired particle constitution (particle size distribution) can be obtained e.g. by adding a low-expansion filler powder having particle sizes within a range of from 0.5 T to 1 T to a low-expansion filler powder having a maximum particle size less than 0.5 T, or by classifying a low-expansion filler powder having a maximum particle size exceeding 1 T to remove particles having particle sizes exceeding 1 T. Further, a low-expansion filler powder having particle sizes within a range of from 0.5 T to 1 T may be added to a low-expansion filler powder having a maximum particle size less than 1 T.

In such a manner, by forming the sealing material layer 5 by the glass material for sealing containing low-expansion filler particles having particle sizes within a range of from 0.5 T to 1 T based on the thickness T in a volume ratio of from 0.1 to 50%, the stress formed particularly at the laser light irradiation completion point can be relaxed when the sealing material layer 5 in the form of a frame is irradiated with a laser light with scanning over the perimeter of the sealing material layer 5 to seal the space between the first and second glass substrates 2 and 3. Therefore, it is possible to suppress failures by fractures, cracks and the like of the glass substrates 2 and 3 while the space between the first and second glass substrates 2 and 3 is favorably hermetically sealed. That is, a glass panel having increased sealing property and reliability and thus an electronic device excellent in hermetically sealing property can be provided.

The effect of suppressing fractures, cracks and the like of the glass substrates 2 and 3 by the low-expansion filler having the above-described particle constitution (a low-expansion filler powder containing no particles having particle sizes exceeding 1 T and containing particles having particle sizes within a range of from 0.5 T to 1 T in a predetermined range), will be described in the light of a step of forming the sealing material layer 5 and a step of sealing by a laser light (laser sealing-step). The sealing material layer 5 comprising the glass material for sealing containing low-expansion filler particles having particle sizes within a range of from 0.5 T to 1 T is formed, for example, as follows on the sealing region 3a of the second glass substrate 3.

First, the glass material for sealing is mixed with a vehicle to prepare a sealing material paste. The vehicle may, for example, be one having methyl cellulose, ethyl cellulose, carboxymethyl cellulose, oxyethyl cellulose, benzyl cellulose, propyl cellulose, nitrocellulose or the like dissolved in a solvent such as terpineol, butyl carbitol acetate or ethyl carbitol acetate, or one having an acrylic resin of e.g. methyl (meth)acrylate, ethyl (meth)acrylate, butyl (meth)acrylate or 2-hydroxyethyl methacrylate dissolved in a solvent such as methyl ethyl ketone, terpineol, butyl carbitol acetate or ethyl carbitol acetate.

The viscosity of the sealing material paste is fitted to the viscosity in accordance with an apparatus which applies the paste on the glass substrate 3, and may be adjusted by the ratio of the resin (binder component) to the solvent or the ratio of the glass material for sealing to the vehicle. To the sealing material paste, known additives for a glass paste, such as an antifoaming agent or a dispersing agent may be added. For preparation of the sealing material paste, a known method employing a rotary mixer equipped with a stirring blade, a roll mill, a ball mill or the like may be applied.

The sealing material paste is applied on the sealing region 3a of the second glass substrate 3 so that the thickness after dried will be T, and the paste is dried to form a coating layer of the sealing material paste. The sealing material paste is applied on the second sealing region 3a employing, for example, a printing method such as screen printing or gravure printing, or applied along the second sealing region 3a using a dispenser or the like. The coating layer of the sealing material paste is dried, for example, at a temperature of at least 120° C. for at least 5 minutes. The drying step is carried out to remove the solvent in the coating layer. If the solvent remains in the coating layer, the binder component may not sufficiently be removed in the following firing step.

The above coating layer of the sealing material paste is fired to form a sealing material layer 5. The thickness of the sealing material layer 5 is preferably from 6 to 120 μm, more preferably from 10 to 65 μm. In the firing step, first, the coating layer is heated to a temperature of at most the glass transition point of the sealing glass (glass frit) as the main component of the glass material for sealing to remove the binder component in the coating layer, and then heated to a temperature of at least the softening point of the sealing glass (glass frit) to melt the glass material for sealing and burn it on the glass substrate 3. In such a manner, a sealing material layer 5 comprising the glass material for sealing containing no low-expansion filler particles having particle sizes exceeding the thickness T and containing low-expansion filler particles having particle sizes within a range of from 0.5 T to 1 T in a volume ratio of from 0.1 to 50%, is formed. The temperature for firing the coating layer depends on the sealing material to be used, and in the case of bismuth glass, it is preferably from 420 to 520° C., more preferably from 450 to 470° C. In the case of tin-phosphate glass, it is preferably from 400 to 500° C., more preferably from 420 to 440° C. Further, the time for firing the coating layer is preferably from 5 to 60 minutes, more preferably from 8 to 15 minutes either in the cases of bismuth glass and tin-phosphate glass.

Then, as shown in FIG. 2(a), by using the second glass substrate 3 having the sealing material layer 5, and a separately prepared first glass substrate 2 having an element-formed region provided with an electronic element, an electronic device 1 such as a FPD such as an OELD, a PDP or a LCD, an illumination apparatus using an OEL element, or a solar cell such as a dye-sensitized solar cell, is prepared. That is, as shown in FIG. 2(*b*), the first glass substrate 2 and the second glass substrate 3 are laminated so that a face having the element-formed region 2*a* and a face having the sealing material layer 5 face each other. On the element-formed region 2*a* of the first glass substrate 2, a space is formed based on the thickness of the sealing material layer 5.

Then, as shown in FIG. 2(*c*), the sealing material layer 5 is irradiated with a laser light 6 through the second glass substrate 3. The sealing material layer 5 in the form of a frame is irradiated with the laser light 6 with scanning along it. The laser light 6 is not particularly limited, and a laser light from e.g. a semiconductor laser, a carbon dioxide laser, an excimer laser, a YAG laser or a HeNe laser may be employed. The output of the laser light 15 is properly set depending on e.g. the thickness of the sealing material layer 5, and is preferably within a range of from 2 to 150 W for example. If the laser output is less than 2 W, the sealing material layer 5 may not sometimes be melted, and if it exceeds 150 W, the glass substrates 2 and 3 are likely to have cracks, fractures and the like. The output of the laser light is more preferably within a range of from 5 to 100 W.

The sealing material layer 5 is sequentially melted from a part irradiated with a laser light 6 with scanning along it, and is quenched and solidified upon completion of irradiation with the laser light 6 and bonded to the first glass substrate 2. Since the sealing material layer 5 in the form of a frame is irradiated with the laser light with scanning along it, the irradiation completion point of the laser light 6 rides the irradiation starting point. With respect to a sealing material layer comprising a conventional glass material for sealing, the thickness is reduced in an amount at a level of from 30 to 50% in the height direction at the time of melting by laser irradiation. Therefore, to the glass substrates 2 and 3 at the laser light irradiation completion point, a stress based on the difference in the thickness of the sealing material layer 5 corresponding to the reduction is applied. This stress is rapidly applied locally, and is thereby considered to cause cracks, fractures and the like on the glass substrates 2 and 3.

On the other hand, according to this embodiment, the sealing material layer 5 is formed by the glass material for sealing containing low-expansion filler particles having particle sizes within a range of from 0.5 T to 1 T based on the thickness T of the sealing material layer 5 in a volume ratio of from 0.1 to 50%, and accordingly the reduction in the thickness direction at the time of the laser irradiation (at the time of melting) can be suppressed. That is, the low-expansion filler particles having particle sizes within a range of from 0.5 T to 1 T function as spacer particles to maintain the distance between the glass substrates 2 and 3, and the change in the thickness of the sealing material layer 5 at the time of melting can be suppressed. Thus, the stress to be applied to the glass substrates 2 and 3 at the laser light 6 irradiation completion point is relaxed, and cracks, fractures and the like of the glass substrates 2 and 3 at the laser light 6 irradiation completion point can be prevented.

In such a manner, the change in the thickness of the sealing material layer 5 is suppressed based on the low-expansion filler particles having particle sizes within a range of from 0.5 T to 1 T. Here, the effect of suppressing the change in the thickness of the sealing material layer 5 cannot be obtained with low-expansion filler particles having particle sizes less than 0.5 T. On the other hand, low-expansion filler particles having particle sizes exceeding 1 T not only make it difficult to control the thickness of the sealing layer 4 but also be originating points of the local stress to cause cracks and the like on the glass substrates 2 and 3. Thus, the glass material for sealing contains no low-expansion filler particles having particle sized exceeding the thickness T.

Further, if the amount of the low-expansion filler particles having particle sizes within a range of from 0.5 T to 1 T in the glass material for sealing is less than 0.1 vol %, the function to maintain the distance between the glass substrates 2 and 3 at the time of the laser sealing will not sufficiently be obtained, and cracks, fractures and the like are likely to form on the laser light irradiation completion point. If the amount of the low-expansion filler particles having particle sizes within a range of from 0.5 T to 1 T exceeds 50 vol %, the content of the low-expansion filler particles having smaller particle sizes is relatively reduced, and the distribution of the low-expansion filler particles in the sealing material layer 5 may be non-uniform. In such a case, the thermal expansion coefficient of the sealing material layer 5 is partially increased, whereby cracks and the like are likely to form in the sealing layer 4 itself.

The amount of the low-expansion filler particles having particle sizes within a range of from 0.5 T to 1 T in the glass material for sealing is preferably at most 10 vol % so as to further uniformalize the distribution of the low-expansion filler particles in the sealing material layer 5. As described above, the glass material for sealing contains the low-expansion filler particles having particle sizes within a range of from 0.5 T to 1 T preferably in a volume ratio of from 0.1 to 10%. Further, for the purpose of increasing the effect of suppressing the change in the thickness direction of the sealing material layer 5 by the low-expansion filler particles, the glass material for sealing contains the low-expansion filler particles having particle sizes within a range of from 0.5 T to 1 T in a volume ratio of more preferably at least 0.5%, further preferably at least 1%.

As described above, the change in the thickness of the sealing material layer 5 at the time of the laser sealing is suppressed by the low-expansion filler particles having particle sizes within a range of from 0.5 T to 1 T. Accordingly, the sealing layer 4 has a thickness Ta substantially equal to the thickness T of the sealing material layer 5. However, even if the thickness Ta of the sealing layer 4 is reduced by about 3% in the thickness direction based on the thickness T of the sealing material layer 5, it is possible to suppress cracks, fractures and the like of the glass substrates 2 and 3. Further, in some cases, the reduction of the thickness Ta of the sealing layer 4 based on the thickness T of the sealing material layer 5 is acceptable if it is at a level up to about 20%.

According to this embodiment, an electronic device 1 provided with a sealing layer 4 having a thickness Ta substantially equal to the thickness T of the sealing material layer 5 is realized. In such a case, the sealing layer 4 contains no low-expansion filler particles having particle sized exceeding the thickness Ta and contains low-expansion filler particles having particle sizes within a range of from 0.5 Ta to 1 Ta based on the thickness Ta in a volume ratio of from 0.1 to 50%, whereby cracks, fractures and the like of the glass substrates 2 and 3 are suppressed. Further, even if the thickness Ta of the sealing layer 4 is reduced relative to the thickness T of the sealing material layer 5, the reduction is suppressed as far as possible, and accordingly cracks, fractures and the like of the glass substrates 2 and 3 can be suppressed.

Further, by irradiating the sealing material layer 5, the change in the height direction of which at the time of melting is suppressed, with a laser light 6 over the perimeter thereof, a sealing layer 4 which seals the space between the first glass substrate 2 and the second glass substrate 3 is formed as shown in FIG. 2(d). In such a manner, an electronic device 1 having an electronic element formed on an element-formed region 2a hermetically sealed in a glass panel comprising the first glass substrate 2, the second glass substrate 3 and the sealing layer 4, is prepared. The glass panel the interior of which is hermetically sealed is not limited to an electronic device 1, and can be applied to a sealed product (package) of an electronic component, or a glass member (e.g. a building material) such as vacuum double glazing.

In the procedure for production of the electronic device 1 according to this embodiment, the change in the height of the sealing material layer 5 at the time of the laser irradiation (at the time of melting) is suppressed. Accordingly, the sealing material layer 5 is favorably melted at the time of irradiation with the laser light 6 and in addition, the stress on the glass substrates 2 and 3 particularly the stress on the glass substrates 2 and 3 at the laser light irradiation completion point, at the time of quenching for solidification after melting, can be suppressed. Therefore, a good sealing layer 4 can be obtained without cracks, fractures and the like on the glass substrates 2 and 3. That is, it is possible to prepare an electronic device 1 of which the space between the first and second glass substrates 2 and 3 is hermetically sealed, with a high yield.

EXAMPLES

Now, the present invention will be described in detail with reference to specific Examples and the evaluation results. However, it should be understood that the present invention is by no means restricted to the following specific Examples, and modification within the scope of the present invention is possible.

Example 1

First, tin-phosphate glass frit (softening point: 401° C.) having a composition comprising, by mass ratio, 63.0% of SnO, 2.0% of $SnO_2$, 29.5% of $P_2O_5$, 5.0% of ZnO and 0.5% of $SiO_2$, and having an average particle size of 3 μm, a zirconium phosphate $((ZrO)_2P_2O_7)$ powder having an average particle size (D50) of 9.3 μm and a maximum particle size (Dmax) of 40 μm as a low-expansion filler, and a laser absorbent having a composition comprising, by mass ratio, 35% of $Fe_2O_3$, 35% of $Cr_2O_3$, 20% of $Co_2O_3$ and 10% of MnO, and having an average particle size of 2 μm, were prepared. 4 mass % of nitrocellulose as a binder component was dissolved in 96 mass % of a solvent comprising butyl carbitol acetate to prepare a vehicle.

51 vol % of the tin-phosphate glass frit, 45.2 vol % of the zirconium phosphate powder and 3.8 vol % of the laser absorbent were mixed to prepare a glass material for sealing (thermal expansion coefficient: $45 \times 10^{-7}/°$ C.). 80 mass % of this glass material for sealing was mixed with 20 mass % of the vehicle to prepare a sealing material paste. Then, on the outer peripheral region of a second glass substrate (dimensions: 90×90×0.7 mmt) comprising alkali-free glass (thermal expansion coefficient: $38 \times 10^{-7}/°$ C.), the sealing material paste was applied (line width: 1 mm) by a screen printing method and dried at 130° C. for 5 minutes. The resulting coating layer was fired at 430° C. for 10 minutes to form a sealing material layer having a thickness T of 40 μm. In Example 1, the aimed thickness of the sealing layer to be formed by melting the sealing material layer by a laser light is 40 μm.

The zirconium phosphate powder as the low-expansion filler contains no particles having particle sizes exceeding the thickness T (40 μm) of the sealing material layer and contains particles having particle sizes (from 20 to 40 μm) within a range of from 0.5 T to 1 T based on the thickness T (40 μm) of the sealing material layer in a volume ratio of 8.5%. Accordingly, the glass material for sealing prepared by mixing such a low-expansion filler with the tin-phosphate glass frit and the laser absorbent contains low-expansion filler particles having particles sizes (from 20 to 40 μm) within a range of from 0.5 T to 1 T based on the thickness T (40 μm) in a volume ratio of 3.8%. The zirconium phosphate powder is one having the particle constitution adjusted by removing particles having particle sizes exceeding 40 μm by an air classifier after pulverization by a ball mill.

The second glass substrate having the above-described sealing material layer and a first glass substrate (a substrate comprising alkali-free glass having the same composition and the same shape as those of the second glass substrate) having an element-formed region (a region on which an OEL element was formed) were laminated. Then, the sealing material layer was irradiated with a laser light (semiconductor laser) having a wavelength of 940 nm at an output of 25 W at a scanning rate of 10 mm/s through the second glass substrate over the perimeter from the irradiation starting point to the irradiation completion point of the second glass substrate to melt and quench to solidify the sealing material layer thereby to bond the first glass substrate and the second glass substrate. In the following Examples 2 to 12 and Comparative Examples 1 to 3, the laser irradiation was carried out through the second glass substrate over the perimeter from the irradiation starting point to the irradiation completion point of the second glass substrate. In such a manner, an electronic device having the element-formed region sealed in a glass panel was prepared and subjected to the after-mentioned evaluation of properties.

Example 2

A sealing material layer was formed in the same manner as in Example 1 except that the coating thickness of the sealing material paste was changed so that the thickness T of the sealing material layer after fired would be 60 μm. The aimed thickness of the sealing layer is 60 μm. The zirconium phosphate powder contains no particles having particle sizes exceeding the thickness T (60 μm) of the sealing material layer and contains particles having particle sizes (from 30 to 60 μm) within a range of from 0.5 T to 1 T based on the thickness T (60 μm) of the sealing material layer in a volume ratio of 1.5%. Accordingly, the glass material for sealing contains low-expansion filler particles having particle sizes (from 30 to 60 μm) within a range of from 0.5 T to 1 T based on the thickness T (60 μm) in a volume ratio of 0.68%.

Then, the second glass substrate having the sealing material layer and a first glass substrate having an element-formed region (a region on which an OEL element was formed) were laminated. The first and second glass substrates comprise alkali-free glass in the same manner as in Example 1. Then, the sealing material layer was irradiated with a laser light (semiconductor laser) having a wavelength of 940 nm at an output of 30 W at a scanning rate of 10 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 3

A sealing material layer was formed in the same manner as in Example 1 except that tin-phosphate glass frit having a composition comprising, by mass ratio, 63.3% of SnO, 2.3% of $SnO_2$, 31.2% of $P_2O_5$, 3.0% of ZnO and 0.2% of $SiO_2$ was used. In Example 1, the aimed thickness of a sealing layer to be formed by melting the sealing material layer by a laser light is 40 μm.

Then, the second glass substrate having the sealing material layer and a first glass substrate having an element-formed region (a region on which an OEL element was formed) were laminated. The first and second glass substrates comprise alkali-free glass in the same manner as in Example 1. Then, the sealing material layer was irradiated with a laser light (semiconductor laser) having a wavelength of 940 nm at an output of 25 W at a scanning rate of 10 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 4

Bismuth glass frit (softening point: 420° C.) having a composition comprising, by mass ratio, 82.0% of $Bi_2O_3$, 6.5% of $B_2O_3$, 11.0% of ZnO and 0.5% of $Al_2O_3$ and having an average particle size of 2 μm, a cordierite powder having an average particle size (D50) of 4.5 μm and a maximum particle size (Dmax) of 11 μm as a low-expansion filler, and a laser absorbent having the same composition and average particle size as in Example 1 were prepared. Further, 5 mass % of ethyl cellulose as a binder component was dissolved in 95 mass % of a mixed solvent comprising terpineol (31.6%) and propylene glycol diacetate (68.4%) to prepare a vehicle. 80.4 mol % of the bismuth glass frit, 17.6 vol % of the cordierite powder and 2.0 vol % of the laser absorbent were mixed to prepare a glass material for sealing (thermal expansion coefficient: $82 \times 10^{-7}/°$ C.). 84 mass % of this glass material for sealing was mixed with 16 mass % of the vehicle to prepare a sealing material paste. Then, on the outer peripheral region of a second glass substrate (dimensions: 100×100×0.55 mmt) comprising soda lime glass (thermal expansion coefficient: $87 \times 10^{-7}/°$ C.), the sealing material paste was applied (line width: 1 mm) by a screen printing method and dried at 130° C. for 5 minutes. This coating layer was fired at 450° C. for 10 minutes to form a sealing material layer having a thickness T of 12 μm. In Example 3, the aimed thickness of a sealing layer to be formed by melting the sealing material layer by a laser light is 12 μm.

The cordierite powder as a low-expansion filler contains no particles having particle sizes exceeding the thickness T (12 μm) of the sealing material layer and contains particles having particle sizes (from 6 to 12 μm) within a range of from 0.5 T to 1 T based on the thickness T (12 μm) in a volume ratio of 25.6%. Accordingly, the glass material for sealing prepared by mixing such a low-expansion filler with the bismuth glass frit and the laser absorbent contains low-expansion filler particles having particle sizes (from 6 to 12 μm) within a range of from 0.5 T to 1 T based on the thickness T (12 μm) in a volume ratio of 4.5%. The cordierite powder is one having the particle constitution adjusted by removing particles having particle sizes exceeding 11 μm by an air classifier after pulverization by a ball mill.

Then, the second glass substrate having the sealing material layer and a first glass substrate (substrate comprising soda lime glass having the same composition and the same shape as those of the second glass substrate) having an element-formed region (a region on which an OEL element was formed) were laminated. Then, the sealing material layer was irradiated with a laser light (semiconductor laser) having a wavelength of 940 nm at an output of 65 W at a scanning rate of 5 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 5

A sealing material paste was prepared in the same manner as in Example 4 except that 73.5 vol % of the bismuth glass frit, 24.5 vol % of the cordierite powder and 2.0 vol % of the laser absorbent were mixed to prepare a glass material for sealing (thermal expansion coefficient: $72 \times 10^{-7}/°$ C.). In the same manner as in Example 4, this sealing material paste was applied on the outer peripheral region of the second glass substrate and fired at 450° C. for 10 minutes to form a sealing material layer having a thickness T of 12 μm. The aimed thickness of the sealing layer is 12 μm. The cordierite powder as the low-expansion filler contains no particles having particle sizes exceeding the thickness T (12 μm) of the sealing material layer and contains particles having particle sizes (from 6 to 12 μm) within a range of from 0.5 T to 1 T based on the thickness T (12 μm) of the sealing material layer in a volume ratio of 25.6%. Accordingly, the glass material for sealing contains low-expansion filler particles having particle sizes (from 6 to 12 μm) within a range of from 0.5 T to 1 T based on the thickness T (12 μm) in a volume ratio of 6.3%.

Then, the second glass substrate having the sealing material layer and a first glass substrate having an element-formed region (a region on which an OEL element was formed) were laminated. The first and second glass substrates comprise soda lime glass in the same manner as in Example 4. Then, the sealing material layer was irradiated with a laser light (semiconductor laser) having a wavelength of 940 nm at an output of 70 W at a scanning rate of 5 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 6

A sealing material layer was formed in the same manner as in Example 5 except that the coating thickness of the sealing material paste was changed so that the thickness T of the sealing material layer after fired would be 15 μm. The aimed thickness of the sealing layer is 15 μm. The cordierite powder contains no particles having particle sizes exceeding the thickness T (15 μm) of the sealing material layer and contains particles having particle sizes (from 7.5 to 15 μm) within a range of from 0.5 T to 1 T based on the thickness T (15 μm) of the sealing material layer in a volume ratio of 4.5%. Accordingly, the glass material for sealing contains low-expansion filler particles having particle sizes (from 7.5 to 15 μm) within a range of from 0.5 T to 1 T based on the thickness T (15 μm) in a volume ratio of 1.1%.

Then, the second glass substrate having the sealing material layer and a first glass substrate having an element-formed region (a region on which an OEL element was formed) were laminated. The first and second glass substrates comprise soda lime glass in the same manner as in Example 4. Then, the sealing material layer was irradiated with a laser light (semiconductor laser) having a wavelength of 940 nm at an output of 70 W at a scanning rate of 5 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 7

A sealing material paste was prepared in the same manner as in Example 4 except that 65.7 vol % of the bismuth glass frit, 32.3 vol % of the cordierite powder and 2.0 vol % of the laser absorbent were mixed to prepare a glass material for sealing (thermal expansion coefficient: $65 \times 10^{-7}/°$ C.). In the same manner as in Example 4, this sealing material paste was applied on the outer peripheral region of the second glass substrate and fired at 450° C. for 10 minutes to form a sealing material layer having a thickness T of 20 μm. The aimed thickness of the sealing layer is 20 μm.

The cordierite powder as the low-expansion filler contains no particles having particle sizes exceeding the thickness T (20 μm) of the sealing material layer and contains particles having particle sizes (from 10 to 20 μm) within a range of from 0.5 T to 1 T based on the thickness T (20 μm) of the sealing material layer in a volume ratio of 0.4%. Accordingly, the glass material for sealing contains low-expansion filler particles having particle sizes (from 10 to 20 μm) within a range of from 0.5 T to 1 T based on the thickness T (20 μm) in a volume ratio of 0.13%.

Then, the second glass substrate having the sealing material layer and a first glass substrate having an element-formed region (a region on which an OEL element was formed) were laminated. The first and second glass substrates comprise soda lime glass in the same manner as in Example 4. Then, the sealing material layer was irradiated with a laser light (semiconductor laser) having a wavelength of 940 nm at an output of 72 W at a scanning rate of 5 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 8

A sealing material layer was formed in the same manner as in Example 5 except that a second glass substrate comprising soda lime glass having a thickness of 1.1 mm was used. The thickness T of the sealing material layer and the aimed thickness of the sealing layer are 12 μm. The cordierite powder contains no particles having particle sizes exceeding the thickness T (12 μm) of the sealing material layer and contains particles having particle sizes (from 6 to 12 μm) within a range of from 0.5 T to 1 T based on the thickness T (12 μm) of the sealing material layer in a volume ratio of 25.6%. Accordingly, the glass material for sealing contains low-expansion filler particles having particle sizes (from 6 to 12 μm) within a range of from 0.5 T to 1 T based on the thickness T (12 μm) in a volume ratio of 6.3%.

Then, the second glass substrate having the sealing material layer and a first glass substrate (substrate comprising soda lime glass having the same composition and the same shape as those of the second glass substrate) having an element-formed region (a region on which an OEL element was formed) were laminated. Then, the sealing material layer was irradiated with a laser light (semiconductor laser) having a wavelength of 808 nm at an output of 20 W at a scanning rate of 2 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 9

Bismuth glass frit having the same composition and average particle size as in Example 4, a cordierite powder having an average particle size (D50) of 10 μm and a maximum particle size (Dmax) of 37 μm as a low-expansion filler, and a laser absorbent having the same composition and average particle size as in Example 1 were prepared. The vehicle was prepared in the same manner as in Example 4. The cordierite powder was prepared by mixing the cordierite powder used in Example 4 with a cordierite powder obtained by removing particles having particle sizes exceeding 37 μm and particles having particle sizes less than 10 μm removed by an air classifier.

84 mass % of a glass material for sealing (thermal expansion coefficient: $82 \times 10^{-7}/°$ C.) prepared by mixing 80.4 vol % of the bismuth glass frit, 17.6 vol % of the cordierite powder and 2.0 vol % of the laser absorbent was mixed with 16 mass % of the vehicle to prepare a sealing material paste. Then, on the outer peripheral region of a second glass substrate (dimensions: 100×100×1.1 mmt) comprising soda lime glass (thermal expansion coefficient: $87 \times 10^{-7}/°$ C.), the sealing material paste was applied by a screen printing method and dried at 130° C. for 5 minutes. The resulting coating layer (line width: 1 mm) was fired at 450° C. for 10 minutes to form a sealing material layer having a thickness T of 40 μm. The aimed thickness of the sealing layer is 40 μm.

The cordierite powder as the low-expansion filler contains no particles having particle sizes exceeding the thickness T (12 μm) of the sealing material layer and contains particles having particle sizes (from 20 to 40 μm) within a range of from 0.5 T to 1 T based on the thickness T (40 μm) of the sealing material layer in a volume ratio of 9.5%. Accordingly, the glass material for sealing contains low-expansion filler particles having particle sizes (from 20 to 40 μm) within a range of from 0.5 T to 1 T based on the thickness T (40 μm) in a volume ratio of 1.7%.

Then, the second glass substrate having the sealing material layer and a first glass substrate (substrate comprising soda lime glass having the same composition and the same shape as those of the second glass substrate) having an element-formed region (a region on which an OEL element was formed) were laminated. Then, the sealing material layer was irradiated with a laser light (semiconductor laser) having a wavelength of 808 nm at an output of 25 W at a scanning rate of 1 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 10

A sealing material paste was prepared in the same manner as in Example 9 except that 73.5 vol % of the bismuth glass frit, 24.5 vol % of the cordierite powder and 2.0 vol % of the laser absorbent were mixed to prepare a glass material for sealing (thermal expansion coefficient: $72\times10^{-7}/°$ C.). In the same manner as in Example 9, this sealing material paste was applied on the outer peripheral region of the second glass substrate and fired at 450° C. for 10 minutes to form a sealing material layer having a thickness T of 40 μm. The aimed thickness of the sealing layer is 40 μm.

The cordierite powder as the low-expansion filler contains no particles having particle sizes exceeding the thickness T (40 μm) of the sealing material layer and contains particles having particle sizes (from 20 to 40 μm) within a range of from 0.5 T to 1 T based on the thickness T (40 μm) of the sealing material layer in a volume ratio of 1.0%. Accordingly, the glass material for sealing contains low-expansion filler particles having particle sizes (from 20 to 40 μm) within a range of from 0.5 T to 1 T based on the thickness T (40 μm) in a volume ratio of 0.25%.

Then, the second glass substrate having the sealing material layer and a first glass substrate having an element-formed region (a region on which an OEL element was formed) were laminated. The first and second glass substrates comprise soda lime glass in the same manner as in Example 9. Then, the sealing material layer was irradiated with a laser light (semiconductor laser) having a wavelength of 808 nm at an output of 25 W at a scanning rate of 1 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 11

Bismuth glass frit having the same composition and average particle size as those in Example 4, a cordierite powder having an average particle size (D50) of 6.3 μm and a maximum particle size (Dmax) of 25 μm as a low-expansion filler, and a laser absorbent having the same composition and average particle size as in Example 1 were prepared. The vehicle was prepared in the same manner as in Example 3.

84 mass % of a glass material for sealing (thermal expansion coefficient: $73\times10^{-7}/°$ C.) prepared by mixing 73.5 vol % of the bismuth glass frit, 24.5 vol % of the cordierite powder and 2.0 vol % of the laser absorbent was mixed with 16 mass % of the vehicle to prepare a sealing material paste. Then, on the outer peripheral region of a second glass substrate (dimensions: 100×100×0.55 mmt) comprising soda lime glass (thermal expansion coefficient: $87\times10^{-7}/°$ C.), the sealing material paste was applied by a screen printing method and dried at 130° C. for 5 minutes. This coating layer (line width: 1 mm) was fired at 450° C. for 10 minutes to form a sealing material layer having a thickness T of 25 μm. The aimed thickness of the sealing layer is 25 μm.

The cordierite powder as the low-expansion filler contains no particles having particle sizes exceeding the thickness T (25 μm) of the sealing material layer and contains particles having particle sizes (from 12.5 to 25 μm) within a range of from 0.5 T to 1 T based on the thickness T (25 μm) of the sealing material layer in a volume ratio of 10.5%. Accordingly, the glass material for sealing contains low-expansion filler particles having particle sizes (from 12.5 to 25 μm) within a range of from 0.5 T to 1 T based on the thickness T (25 μm) in a volume ratio of 2.6%.

Then, the second glass substrate having the sealing material layer and a first glass substrate (substrate comprising soda lime glass having the same composition and the same shape as those of the second glass substrate) having an element-formed region (a region on which an OEL element was formed) were laminated. Then, the sealing material layer was irradiated with a laser light (semiconductor laser) having a wavelength of 940 nm at an output of 72 W at a scanning rate of 5 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Example 12

A sealing material paste was prepared in the same manner as in Example 10 except that 65.7 vol % of the bismuth glass frit, 32.4 vol % of the cordierite powder and 2.0 vol % of the laser absorbent were mixed to prepare a glass material for sealing (thermal expansion coefficient: $66\times10^{7}/°$ C.). The sealing material paste was applied on the outer peripheral region of a second glass substrate (dimensions: 100×100×1.1 mmt) comprising soda lime glass, by a screen printing method and dried at 130° C. for 5 minutes. The resulting coating layer (line width: 1 mm) was fired at 450° C. for 10 minutes to form a sealing material layer having a thickness T of 30 μm. The aimed thickness of the sealing layer is 30 μm.

The cordierite powder as the low-expansion filler contains no particles having particle sizes exceeding the thickness T (30 μm) of the sealing material layer and contains particles having particle sizes (from 15 to 30 μm) within a range of from 0.5 T to 1 T based on the thickness T (30 μm) of the sealing material layer in a volume ratio of 4.4%. Accordingly, the glass material for sealing contains low-expansion filler particles having particle sizes (from 15 to 30 μm) within a range of from 0.5 T to 1 T based on the thickness T (30 μm) in a volume ratio of 1.4%.

Then, the second glass substrate having the sealing material layer and a first glass substrate (substrate comprising soda lime glass having the same composition and the same shape as those of the second glass substrate) having an element-formed region (a region on which an OEL element was formed) were laminated. Then, the sealing material layer was irradiated with a laser light (semiconductor laser) having a wavelength of 808 nm at an output of 20 W at a scanning rate of 2 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Then, the second glass substrate having the sealing material layer and a first glass substrate having an element-formed region (a region on which an OEL element was formed) were laminated. The first and second glass substrates comprise soda lime glass in the same manner as in Example 4. Then, the sealing material layer was irradiated with a laser light (semiconductor laser) having a wavelength of 940 nm at an output of 65 W at a scanning rate of 5 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Comparative Example 1

The same bismuth glass fit, cordierite powder and laser absorbent as those in Example 4 were prepared. The vehicle was prepared in the same manner as in Example 4. 73.5 vol % of the bismuth glass frit, 24.5 vol % of the cordierite powder and 2.0 vol % of the laser absorbent were mixed to prepare a glass material for sealing (thermal expansion coefficient: $72 \times 10^{-7}/°C.$). 84 mass % of the glass material for sealing was mixed with 16 mass % of the vehicle to prepare a sealing material paste. In the same manner as in Example 4, the sealing material paste was applied on the outer peripheral region of a second glass substrate comprising soda lime glass and fired at 450° C. for 10 minutes to form a sealing material layer having a thickness T of 26 μm. The aimed thickness of the sealing layer is 25 μm.

Although the cordierite powder as the low-expansion filler contains no particles having particle sizes exceeding the thickness T (26 μm) of the sealing material layer, the volume ratio of particles having particle sizes (from 13 to 26 μm) within a range of from 0.5 T to 1 T based on the thickness T (26 μm) of the sealing material layer is also substantially 0%. Accordingly, the glass material for sealing also has a volume ratio of low-expansion filler particles having particle sizes (from 13 to 26 μm) within a range of from 0.5 T to 1 T based on the thickness T (26 μm) of substantially 0%.

Then, the second glass substrate having the sealing material layer and a first glass substrate having an element-formed region were laminated. The first and second glass substrates comprise soda lime glass in the same manner as in Example 4. Then, the sealing material layer was irradiated with a laser light (semiconductor laser) having a wavelength of 940 nm at an output of 70 W at a scanning rate of 5 mm/s through the second glass substrate to melt and quench to solidify the sealing material layer thereby to bond the first glass substrate and the second glass substrate. An electronic device obtained in such a manner was subjected to the after-mentioned evaluation of properties.

Comparative Example 2

A sealing material paste was prepared in the same manner as in Comparative Example 1 except that 65.7 vol % of the bismuth glass frit, 32.3 vol % of the cordierite powder and 2.0 vol % of the laser absorbent were mixed to prepare a glass material for sealing (thermal expansion coefficient: $65 \times 10^{-7}/°C.$). In the same manner as in Comparative Example 1, the sealing material paste was applied on the outer peripheral region of a second glass substrate and fired at 450° C. for 10 minutes to form a sealing material layer having a thickness T of 32 μm. The aimed thickness of the sealing layer is 30 μm.

Although the cordierite powder as the low-expansion filler contains no particles having particle sizes exceeding the thickness T (32 μm) of the sealing material layer, the volume ratio of particles having particle sizes (from 16 to 32 μm) within a range of from 0.5 T to 1 T based on the thickness T (32 μm) of the sealing material layer is also substantially 0%. Accordingly, the glass material for sealing also has a volume ratio of low-expansion filler particles having particle sizes (from 16 to 32 μm) within a range of from 0.5 T to 1 T based on the thickness T (32 μm) of substantially 0%.

Then, the second glass substrate having the sealing material layer and a first glass substrate having an element-formed region were laminated. The first and second glass substrates comprise soda lime glass in the same manner as in Comparative Example 1. Then, the sealing material layer was irradiated with a laser light (semiconductor laser) having a wavelength of 940 nm at an output of 72 W at a scanning rate of 5 mm/s through the second glass substrate to melt and quench to solidify the sealing material layer thereby to bond the first glass substrate and the second glass substrate. An electronic device obtained in such a manner was subjected to the after-mentioned evaluation of properties.

Comparative Example 3

The bismuth glass frit having the same composition and average particle size as those in Example 4, the same cordierite powder as in Example 9 and the laser absorbent having the same composition and average particle size as those in Example 1 were prepared. The vehicle was prepared in the same manner as in Example 4. 80.4 vol % of the bismuth glass frit, 17.6 vol % of the cordierite powder and 2.0 vol % of the laser absorbent were mixed to prepare a glass material for sealing (thermal expansion coefficient: $82 \times 10^{-7}/°C.$).

Then, 84 mass % of the glass material for sealing was mixed with 16 mass % of the vehicle to prepare a sealing material paste. In the same manner as in Example 4, the sealing material paste was applied on the outer peripheral region of a second glass substrate comprising soda lime glass and fired at 450° C. for 10 minutes to form a sealing material layer having a thickness T of 72 μm. The aimed thickness of the sealing layer is 70 μm.

Although the cordierite powder as the low-expansion filler contains no particles having particle sizes exceeding the thickness T (72 μm) of the sealing material layer, the volume ratio of particles having particle sizes (from 36 to 72 μm) within a range of from 0.5 T to 1 T based on the thickness T (72 μm) of the sealing material layer is 0.2%. Accordingly, the glass material for sealing has a volume ratio of low-expansion filler particles having particle sizes (from 36 to 72 μm) within a range of from 0.5 T to 1 T based on the thickness T (72 μm) of 0.04%.

Then, the second glass substrate having the sealing material layer and a first glass substrate having an element-formed region (a region on which an OEL element was formed) were laminated. The first and second glass substrates comprise soda lime glass in the same manner as in Example 3. Then, the sealing material layer was irradiated with a laser light (semiconductor laser) having a wavelength of 940 nm at an output of 25 W at a scanning rate of 1 mm/s through the second glass substrate to melt and quench to solidify the sealing material layer thereby to bond the first glass substrate and the second glass substrate. In such a manner, an electronic device having the element-formed region sealed in a glass panel was prepared and subjected to the after-mentioned evaluation of properties.

Then, with respect to the outer appearance of each of glass panels in Examples 1 to 12, Reference Example 1 and Comparative Examples 1 to 3, the substrate fracture at the laser light irradiation completion point, cracks of the sealing layer and separation of the sealing layer were evaluated. The outer appearance was observed by an optical microscope and evaluated. Further, the airtightness of each glass panel was measured. The airtightness was evaluated by employing helium leak test. The evaluation results are shown in Tables 1, 2, 3 and 4. Conditions for production of the glass panels are also shown in Tables 1 to 4.

TABLE 1

|  |  |  | Ex. 1 | Ex. 2 | Ex. 3 | Ex. 4 | Ex. 5 |
|---|---|---|---|---|---|---|---|
| Glass material for sealing | Glass frit | Material | Tin-phosphate glass | | | Bismuth glass | |
| | | Blend ratio (vol %) | 51 | 51 | 51 | 80.4 | 73.5 |
| | Low-expansion filler | Material | Zirconium phosphate | | | Cordierite | |
| | | Average particle size (μm) | 9.3 | 9.3 | 9.3 | 4.5 | 4.5 |
| | | Maximum particle size (μm) | 40 | 40 | 40 | 11 | 11 |
| | | Blend ratio (vol %) | 45.2 | 45.2 | 45.2 | 17.6 | 24.5 |
| | Laser absorbent | Average particle size (μm) | 2 | 2 | 2 | 2 | 2 |
| | | Blend ratio (vol %) | 3.8 | 3.8 | 3.8 | 2 | 2 |
| | Thermal expansion coefficient ($\times 10^{-7}/°C$) | | 45 | 45 | 45 | 82 | 72 |
| Paste | Glass material for sealing (mass %) | | 80 | 80 | 80 | 84 | 84 |
| | Vehicle (mass %) | | 20 | 20 | 20 | 16 | 16 |
| Glass substrate | Material | | Alkali-free glass | | | Soda lime glass | |
| | Thickness (mm) | | 0.7 | 0.7 | 0.7 | 0.55 | 0.55 |
| Firing step | Thickness of sealing material layer (μm) | | 40 | 60 | 40 | 12 | 12 |
| | Firing temperature (°C) | | 430 | 430 | 430 | 450 | 450 |
| Ratio of 0.5 T to 1 T particles in low-expansion filler (vol %) | | | 8.5 | 1.5 | 8.5 | 25.6 | 25.6 |
| Ratio of 0.5 T to 1 T particles in sealing material (vol %) | | | 3.8 | 0.68 | 3.8 | 4.5 | 6.3 |
| Laser light | Wavelength (nm) | | 940 | 940 | 940 | 940 | 940 |
| | Output (W) | | 25 | 30 | 25 | 65 | 70 |
| | Scanning rate (mm/s) | | 10 | 10 | 10 | 5 | 5 |
| Evaluation results | Outer appearance | Substrate cracks | Nil | Nil | Nil | Nil | Nil |
| | | Sealing layer cracks | Nil | Nil | Nil | Nil | Nil |
| | | Separation | Nil | Nil | Nil | Nil | Nil |
| | Thickness of sealing layer (μm) | | 40 | 59 | 40 | 12 | 12 |
| | Airtightness | | Observed | Observed | Observed | Observed | Observed |

TABLE 2

|  |  |  | Ex. 6 | Ex. 7 | Ex. 8 |
|---|---|---|---|---|---|
| Glass material for sealing | Glass frit | Material | Bismuth glass | | |
| | | Blend ratio (vol %) | 73.5 | 65.7 | 73.5 |
| | Low-expansion filler | Material | Cordierite | | |
| | | Average particle size (μm) | 4.5 | 4.5 | 4.5 |
| | | Maximum particle size (μm) | 11 | 11 | 11 |
| | | Blend ratio (vol %) | 24.5 | 32.3 | 24.5 |
| | Laser absorbent | Average particle size (μm) | 2 | 2 | 2 |
| | | Blend ratio (vol %) | 2 | 2 | 2 |
| | Thermal expansion coefficient ($\times 10^{-7}/°C$) | | 72 | 65 | 72 |
| Paste | Glass material for sealing (mass %) | | 84 | 84 | 84 |
| | Vehicle (mass %) | | 16 | 16 | 16 |
| Glass substrate | Material | | Soda lime glass | | |
| | Thickness (mm) | | 0.55 | 0.55 | 1.1 |
| Firing step | Thickness of sealing material layer (μm) | | 15 | 20 | 12 |
| | Firing temperature (°C) | | 450 | 450 | 450 |
| Ratio of 0.5 T to 1 T particles in low-expansion filler (vol %) | | | 4.5 | 0.4 | 25.6 |
| Ratio of 0.5 T to 1 T particles in sealing material (vol %) | | | 1.1 | 0.13 | 6.3 |
| Laser light | Wavelength (nm) | | 940 | 940 | 808 |
| | Output (W) | | 70 | 72 | 20 |
| | Scanning rate (mm/s) | | 5 | 5 | 2 |
| Evaluation results | Outer appearance | Substrate cracks | Nil | Nil | Nil |
| | | Sealing layer cracks | Nil | Nil | Nil |
| | | Separation | Nil | Nil | Nil |
| | Thickness of sealing layer (μm) | | 15 | 20 | 12 |
| | Airtightness | | Observed | Observed | Observed |

TABLE 3

|  |  |  | Ex. 9 | Ex. 10 | Ex. 11 | Ex. 12 |
|---|---|---|---|---|---|---|
| Glass material for sealing | Glass frit | Material | Bismuth glass | | | |
|  |  | Blend ratio (vol %) | 80.4 | 73.5 | 73.5 | 65.7 |
|  | Low-expansion filler | Material | Cordierite | | | |
|  |  | Average particle size (μm) | 10 | 10 | 6.3 | 6.3 |
|  |  | Maximum particle size (μm) | 37 | 37 | 25 | 25 |
|  |  | Blend ratio (vol %) | 17.6 | 24.5 | 24.5 | 32.4 |
|  | Laser absorbent | Average particle size (μm) | 2 | 2 | 2 | 2 |
|  |  | Blend ratio (vol %) | 2 | 2 | 2 | 2 |
|  | Thermal expansion coefficient (×10$^{-7}$/° C.) |  | 82 | 72 | 73 | 66 |
| Paste |  | Glass material for sealing (mass %) | 84 | 84 | 84 | 84 |
|  |  | Vehicle (mass %) | 16 | 16 | 16 | 16 |
| Glass substrate |  | Material | Soda lime glass | | | |
|  |  | Thickness (mm) | 1.1 | 1.1 | 0.55 | 1.1 |
| Firing step | Thickness of sealing material layer (μm) |  | 40 | 40 | 25 | 30 |
|  | Firing temperature (° C.) |  | 450 | 450 | 450 | 450 |
| Ratio of 0.5 T to 1 T particles in low-expansion filler (vol %) |  |  | 9.5 | 1 | 10.5 | 4.4 |
| Ratio of 0.5 T to 1 T particles in sealing material (vol %) |  |  | 1.7 | 0.25 | 2.6 | 1.4 |
| Laser light | Wavelength (nm) |  | 808 | 808 | 940 | 808 |
|  | Output (W) |  | 25 | 25 | 72 | 20 |
|  | Scanning rate (mm/s) |  | 1 | 1 | 5 | 2 |
| Evaluation results | Outer appearance | Substrate cracks | Nil | Nil | Nil | Nil |
|  |  | Sealing layer cracks | Nil | Nil | Nil | Nil |
|  |  | Separation | Nil | Nil | Nil | Nil |
|  | Thickness of sealing layer (μm) |  | 40 | 40 | 25 | 30 |
|  | Airtightness |  | Observed | Observed | Observed | Observed |

TABLE 4

|  |  |  | Comp. Ex. 1 | Comp. Ex. 2 | Comp. Ex. 3 |
|---|---|---|---|---|---|
| Sealing material | Glass frit | Material | Bismuth glass | | |
|  |  | Blend ratio (vol %) | 73.5 | 65.7 | 80.4 |
|  | Low-expansion filler | Material | Cordierite | | |
|  |  | Average particle size (μm) | 4.5 | 4.5 | 10 |
|  |  | Maximum particle size (μm) | 11 | 11 | 37 |
|  |  | Blend ratio (vol %) | 24.5 | 32.4 | 17.6 |
|  | Laser absorbent | Average particle size (μm) | 2 | 2 | 2 |
|  |  | Blend ratio (vol %) | 2 | 2 | 2 |
|  | Thermal expansion coefficient (×10$^{-7}$/° C.) |  | 72 | 65 | 82 |
| Paste |  | Sealing material (mass %) | 84 | 84 | 84 |
|  |  | Vehicle (mass %) | 16 | 16 | 16 |
| Glass substrate |  | Material | Soda lime glass (thickness: 0.55 mm) | | |
| Firing step | Thickness of sealing material layer (μm) |  | 26 | 32 | 72 |
|  | Firing temperature (° C.) |  | 450 | 450 | 450 |
| Ratio of 0.5 T to 1 T particles in low-expansion filler (vol %) |  |  | 0 | 0 | 0.2 |
| Ratio of 0.5 T to 1 T particles in sealing material (vol %) |  |  | 0 | 0 | 0.04 |
| Laser light | Wavelength (nm) |  | 940 | 940 | 940 |
|  | Output (W) |  | 70 | 72 | 25 |
|  | Scanning rate (mm/s) |  | 5 | 5 | 1 |
| Evaluation results | Outer appearance | Substrate cracks | Observed | Observed | Observed |
|  |  | Sealing layer cracks | Nil | Nil | Nil |
|  |  | Separation | Observed | Observed | Observed |
|  | Thickness of sealing layer (μm) |  | — | — | — |
|  | Airtightness |  | Nil | Nil | Nil |

As evident from Tables 1, 2 and 3, each of the glass panels in Examples 1 to 12 is excellent in the outer appearance and the airtightness. Whereas, in each of the glass panels in Comparative Examples 1 to 3 wherein a low-expansion filler having a volume ratio of particles having particle sizes within a range of 0.5 T to 1 T based on the thickness T of the sealing material layer of less than 0.1% was used, fractures formed on the glass substrate at the laser light irradiation completion point as shown in Table 4, and the glass substrates could not favorably be bonded.

INDUSTRIAL APPLICABILITY

The present invention is applicable to production of a glass member provided with a sealing material layer, and an electronic device such as a flat panel display device such as an organic EL display, a plasma display panel or a liquid crystal display device or a dye-sensitized solar cell.

The entire disclosure of Japanese Patent Application No. 2008-301535 filed on Nov. 26, 2008 including specification, claims, drawings and summary is incorporated herein by reference in its entirety.

REFERENCE SYMBOLS

1: Electronic device, 2: first glass substrate, 2a: element-formed region, 2b: first sealing region, 3: second glass substrate, 3a: second sealing region, 4: sealing layer, 5: sealing material layer, 6: laser light.

What is claimed is:

1. A glass member provided with a sealing material layer, which comprises a glass substrate having a sealing region; and a sealing material layer comprising a glass material for sealing containing a low-expansion filler comprising low-expansion filler particles and a laser absorbent, provided on the sealing region of the glass substrate; wherein the glass material for sealing contains no low-expansion filler particles having particle sizes exceeding the thickness T of the sealing material layer and contains low-expansion filler particles having particles sizes within a range of from 0.5 T to 1 T based on the thickness T of the sealing material layer in a volume ratio of from 0.1 to 50%.

2. The glass member provided with a sealing material layer according to claim 1, wherein the low-expansion filler comprises at least one member selected from silica, alumina, zirconia, zirconium silicate, cordierite, a zirconium phosphate compound, soda lime glass and borosilicate glass, and the glass material for sealing contains the low-expansion filler in an amount of from 15 to 50 vol %.

3. The glass member provided with a sealing material layer according to claim 1, wherein the laser absorbent comprises at least one metal selected from Fe, Cr, Mn, Co, Ni and Cu or a compound containing the metal, and the glass material for sealing contains the laser absorbent in an amount of from 0.1 to 10 vol %.

4. The glass member provided with a sealing material layer according to claim 1, wherein the glass material for sealing contains the low-expansion filler particles having particle sizes within a range of from 0.5 T to 1 T in a volume ratio of from 0.1 to 10%.

5. The glass member provided with a sealing material layer according to claim 1, wherein the glass substrate comprises soda lime glass or alkali-free glass.

6. The glass member provided with a sealing material layer according to claim 1, wherein the glass material for sealing contains, as the main component, sealing glass comprising tin-phosphate glass or bismuth glass.

7. The glass member provided with a sealing material layer according to claim 1, wherein said volume ratio is from 0.1 to 25.6%.

8. The glass member provided with a sealing material layer according to claim 1, wherein said low-expansion filler is contained in an amount of 15 to 50 vol %.

9. The glass member provided with a sealing material layer according to claim 1, wherein said glass substrate has a thermal expansion coefficient of 35 to $40 \times 10^{-7}/°$ C. and said low-expansion filler is contained in an amount of 30 to 50 vol %.

10. The glass member provided with a sealing material layer according to claim 1, wherein said glass substrate has a thermal expansion coefficient of 85 to $90 \times 10^{-7}/°$ C. and said low-expansion filler is contained in an amount of 15 to 40 vol %.

11. The glass member provided with a sealing material layer according to claim 1, wherein said sealing material layer has a thickness of from 6 to 120 μm.

12. The glass member provided with a sealing material layer according to claim 1, wherein said sealing material layer has a thickness of from 10 to 65 μm.

13. An electronic device which comprises a first glass substrate having an element-formed region provided with an electronic element and a first sealing region provided on the outer peripheral side of the element-formed region; a second glass substrate having a second sealing region corresponding to the first sealing region of the first glass substrate; and a sealing layer comprising a melt-bonded layer of a glass material for sealing containing a low-expansion filler comprising low-expansion filler particles and a laser absorbent, formed to seal a space between the first sealing region of the first glass substrate and the second sealing region of the second glass substrate while a space is provided on the element-formed region; wherein the glass material for sealing contains no low-expansion filler particles having particle sizes exceeding the thickness Ta of the sealing layer and contains low-expansion filler particles having particles sizes within a range of from 0.5 Ta to 1 Ta based on the thickness Ta of the sealing layer in a volume ratio of from 0.1 to 50%.

14. The electronic device according to claim 13, wherein the electronic element is an organic EL element or a solar cell element.

15. A process for producing an electronic device, which comprises a step of preparing a first glass substrate having an element-formed region provided with an electronic element and a first sealing region provided on the outer peripheral side of the element-formed region; a step of preparing a second glass substrate having a second sealing region corresponding to the first sealing region of the first glass substrate, and a sealing material layer comprising a glass material for sealing containing a low-expansion filler comprising low-expansion filler particles and a laser absorbent, formed on the second sealing region; a step of laminating the first glass substrate and the second glass substrate via the sealing material layer while a space is formed on the element-formed region; and a step of irradiating the sealing material layer with a laser light through the second glass substrate to melt the sealing material layer thereby to form a sealing layer to seal the space between the first glass substrate and the second glass substrate; wherein the glass material for sealing contains no low-expansion filler particles having particle sizes exceeding the thickness T of the sealing material layer and contains low-expansion filler particles having particles sizes within a range of from 0.5 T to 1 T based on the thickness T of the sealing material layer in a volume ratio of from 0.1 to 50%.

16. The process for producing an electronic device according to claim 15, wherein the electronic element is an organic EL element or a solar cell element.

* * * * *